(12) United States Patent
Chang et al.

(10) Patent No.: US 11,855,130 B2
(45) Date of Patent: Dec. 26, 2023

(54) THREE-DIMENSIONAL DEVICE STRUCTURE INCLUDING SUBSTRATE-EMBEDDED INTEGRATED PASSIVE DEVICE AND METHODS FOR MAKING THE SAME

(71) Applicant: Taiwan Semiconductor Manufacturing Company Limited, Hsinchu (TW)

(72) Inventors: Jen-Yuan Chang, Hsinchu (TW); Chien-Chang Lee, Miaoli County (TW); Chia-Ping Lai, Hsinchu (TW); Tzu-Chung Tsai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 203 days.

(21) Appl. No.: 17/446,053

(22) Filed: Aug. 26, 2021

(65) Prior Publication Data
US 2023/0069315 A1    Mar. 2, 2023

(51) Int. Cl.
| | |
|---|---|
| *H01L 21/00* | (2006.01) |
| *H01L 49/02* | (2006.01) |
| *H01L 23/48* | (2006.01) |
| *H01L 25/065* | (2023.01) |
| *H01L 23/00* | (2006.01) |
| *H01L 23/498* | (2006.01) |

(52) U.S. Cl.
CPC ............ *H01L 28/90* (2013.01); *H01L 23/481* (2013.01); *H01L 23/49816* (2013.01); *H01L 24/08* (2013.01); *H01L 24/32* (2013.01); *H01L 24/33* (2013.01); *H01L 25/0657* (2013.01); *H01L 2224/08146* (2013.01); *H01L 2224/09181* (2013.01); *H01L 2224/32145* (2013.01); *H01L 2224/33181* (2013.01); *H01L 2225/06541* (2013.01)

(58) Field of Classification Search
CPC . H01L 28/90; H01L 23/481; H01L 23/49816; H01L 24/08
See application file for complete search history.

(56) References Cited

U.S. PATENT DOCUMENTS

| | | | |
|---|---|---|---|
| 11,158,590 B1 * | 10/2021 | Lan | H01L 21/288 |
| 11,569,210 B2 * | 1/2023 | Chang Chien | H01L 23/5383 |
| 11,699,638 B2 * | 7/2023 | Chen | H01L 24/10 |
| | | | 257/774 |
| 2020/0091063 A1 * | 3/2020 | Chen | H01L 25/0657 |

(Continued)

FOREIGN PATENT DOCUMENTS

| | | | | | |
|---|---|---|---|---|---|
| CN | 110931451 A | * | 3/2020 | | H01L 21/56 |
| CN | 115528007 A | * | 12/2022 | | H01L 21/56 |

(Continued)

*Primary Examiner* — Laura M Menz
(74) *Attorney, Agent, or Firm* — The Marbury Law Group, PLLC

(57) ABSTRACT

A three-dimensional device structure includes a die including a semiconductor substrate, an interconnect structure disposed on the semiconductor substrate, a through silicon via (TSV) structure that extends through the semiconductor substrate and electrically contacts a metal feature of the interconnect structure, and an integrated passive device (IPD) embedded in the semiconductor substrate and electrically connected to the TSV structure.

17 Claims, 13 Drawing Sheets

(56) References Cited

U.S. PATENT DOCUMENTS

| | | | | |
|---|---|---|---|---|
| 2021/0098567 A1* | 4/2021 | Kim | ........................ | H01L 28/90 |
| 2022/0262695 A1* | 8/2022 | Chang | ................. | H01L 23/5389 |
| 2022/0301981 A1* | 9/2022 | Chang | ................... | H01L 23/522 |
| 2022/0302085 A1* | 9/2022 | Chang | ................. | H01L 25/0652 |
| 2022/0310570 A1* | 9/2022 | Chang | ................... | H01L 21/568 |
| 2022/0359408 A1* | 11/2022 | Tsai | .................... | H01L 23/5226 |
| 2022/0367406 A1* | 11/2022 | Chang | ................... | H01L 23/642 |
| 2022/0384332 A1* | 12/2022 | Chen | .................... | H01L 25/162 |
| 2023/0060208 A1* | 3/2023 | Chang | ..................... | H01L 24/13 |
| 2023/0060324 A1* | 3/2023 | Liu | ................... | H01L 29/66181 |
| 2023/0066372 A1* | 3/2023 | Chang | ................. | H01L 25/0657 |
| 2023/0067714 A1* | 3/2023 | Chang | .................... | H01L 23/60 |
| 2023/0069315 A1* | 3/2023 | Chang | .................... | H01L 28/90 |
| 2023/0092429 A1* | 3/2023 | Dutta | ................ | H01L 21/76898 |
| | | | | 257/301 |
| 2023/0260977 A1* | 8/2023 | Chen | .................... | H01L 25/162 |
| | | | | 257/690 |

FOREIGN PATENT DOCUMENTS

| | | | | |
|---|---|---|---|---|
| CN | 115528008 A | * | 12/2022 | ........... H01L 23/481 |
| TW | 688059 B1 | * | 3/2020 | |

* cited by examiner

THREE-DIMENSIONAL DEVICE STRUCTURE INCLUDING SUBSTRATE-EMBEDDED INTEGRATED PASSIVE DEVICE AND METHODS FOR MAKING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices, Wafer on Wafer (WoW) or Chip on Wafer (CoW). Some of these three-dimensional devices (e.g., 3DIC, SoC, SoIC, WoW, CoW) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
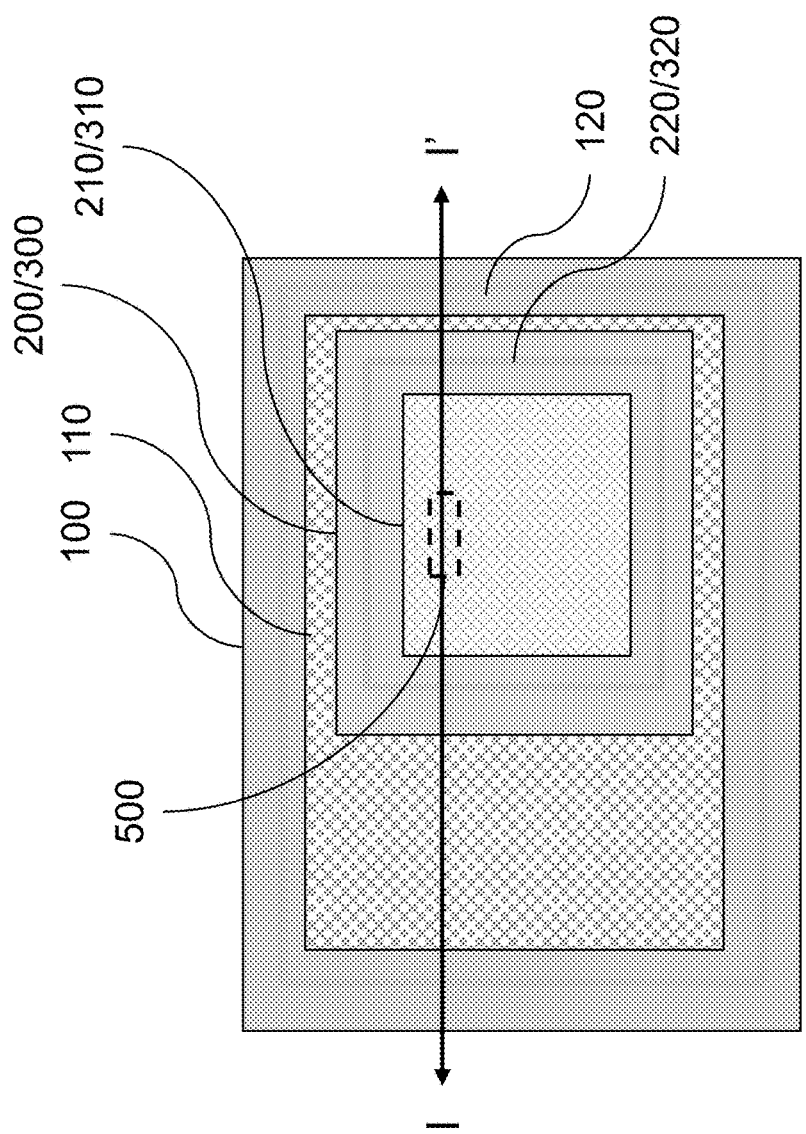
FIG. 1A is a simplified top view of a three-dimensional device structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to three-dimensional device structures that include one or more substrate-embedded integrated passive devices (IPDs), such as deep trench capacitors (DTCs), to provide additional surface space for other surface-mounted IPDs.

A PCB may include various surface-mounted electrical components that are arranged in a two-dimensional format, and electrically connected by conductive lines inside of the PCB. For example, integrated circuit chips may be arranged on the PCB and integrated passive devices (IPDs), such as capacitors, resistors, inductors, transformers, contact pads, etc., may be surface-mounted between the chips. As PCBs have become smaller, the surface area available for mounting electrical components, such as IPDs, has also been reduced, which makes component mounting increasingly difficult.

Accordingly, there is a need for packaging structures that allow for the relocation of electrical components, such as capacitors and/or other integrated passive components, from surface areas of a PCB to other areas, such as within dielectric layers of semiconductor dies, in order to free up surface areas for other components.

Figure 1B:
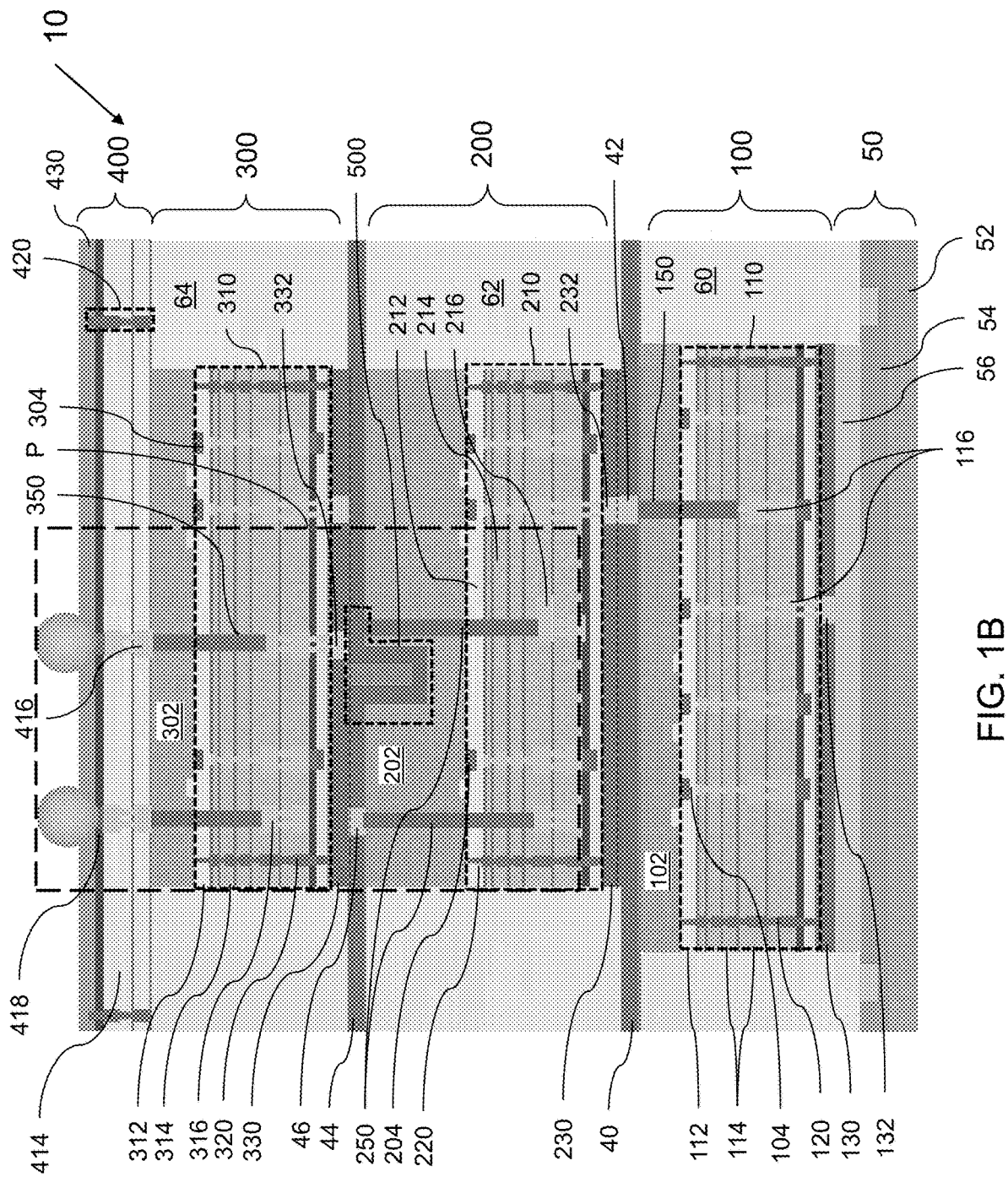
FIG. 1B is a cross-sectional view taken along line I-I' of FIG. 1A.
Figure 1C:
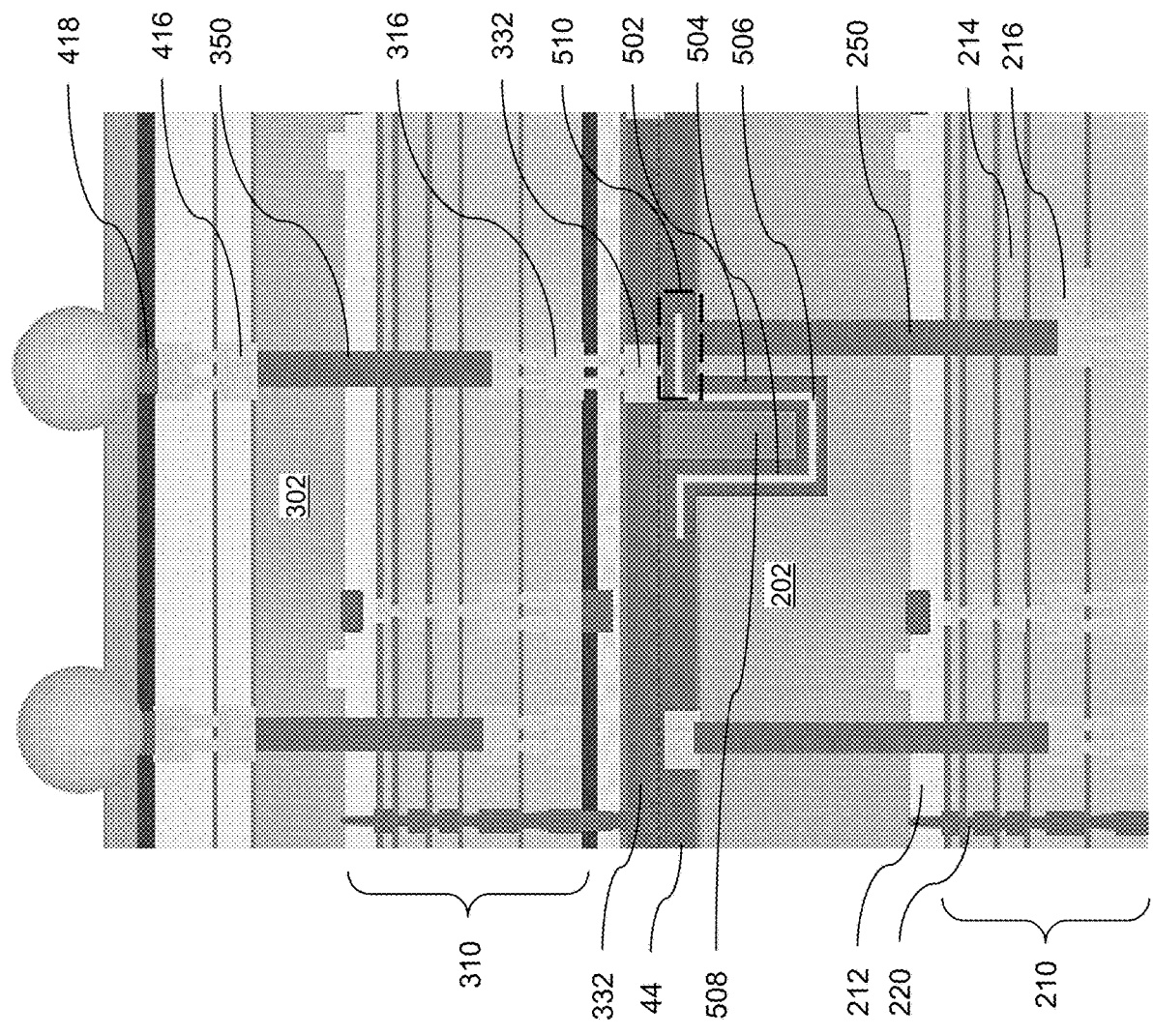
FIG. 1C is an enlarged view of a portion P of FIG. 1B.

FIG. 1A is a simplified top view of a three-dimensional device structure 10, according to various embodiments of the present disclosure. FIG. 1B is a cross-sectional view taken along line I-I' of FIG. 1A. FIG. 1C is an enlarged view of a portion P of FIG. 1B. Referring to FIGS. 1A-1C, the three-dimensional (3D) device structure 10 may be referred to herein as a 3D integrated circuit (3D IC) and may include a wafer 50 upon which a first die 100, a second die 200, and a third die 300 are stacked and bonded to one another. Herein, the numbering of the first die 100, second die 200, and third die 300 is used for descriptive purposes only and is not intended to imply that any particular numbered die is required to have any particular feature described herein.

The wafer 50 may include a semiconductor substrate 52, a passivation layer 54, and a wafer bonding layer 56. The semiconductor substrate 52 may include an elementary semiconductor such as silicon or germanium and/or a compound semiconductor such as silicon germanium, silicon carbide, gallium arsenic, indium arsenide, gallium nitride, or indium phosphide. Other semiconductor materials are within the contemplated scope of disclosure. In some embodiments, the wafer 50 may be a master die including semiconductor devices configured to control the functions of the first die 100, the second die 200, and the third die 300.

The first die 100, the second die 200, and the third die 300 may be, for example, an application-specific integrated circuit (ASIC) chip, an analog chip, a sensor chip, a wireless and radio frequency chip, a voltage regulator chip or a memory chip. In various embodiments, the first die 100, the second die 200, and the third die 300 may be the same or different types of chips. In some embodiments, the first die 100, the second die 200, and the third die 300 may each be an active component or a passive component.

In some embodiments, the first die 100 may include a first semiconductor substrate 102, a first interconnect structure 110, and a front side bonding layer 130. In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 may include isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes gate electrodes 104, source/drain regions, spacers, and the like.

The first die 100 may be inverted and bonded to the wafer 50, such that a front side of the first semiconductor substrate 102 faces the wafer 50. The first interconnect structure 110 may be disposed between the front side of the first semiconductor substrate 102 and the wafer 50.

The first interconnect structure 110 may include an interlayer dielectric (ILD) layer, one or more inter-metal dielectric (IMD) layers 114, metal features 116, and a first seal ring 120. The ILD layer 112 and IMD layer 114 may be collectively referred to as dielectric layers and may be formed of dielectric materials such as silicon oxide ($SiO_2$) silicon nitride (SiN, $Si_3N_4$), silicon carbide (SiC), or the like. Other dielectric materials are within the contemplated scope of disclosure. The dielectric layers 112, 114 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

The metal features 116 may include any of a variety of via structures and metal lines. The metal features 116 may be formed of any suitable electrically conductive material, such as tungsten (W), copper (Cu), a copper alloy, aluminum (Al), an aluminum alloy, combinations thereof, or the like. Other electrically conductive materials are within the contemplated scope of disclosure. In some embodiments, barrier layers (not shown) may be disposed between the metal features 116 and the dielectric layers 112, 114, to prevent the material of the metal features 116 from migrating to the first semiconductor substrate 102. The barrier layer may include Ta, TaN, Ti, TiN, CoW, or combinations thereof, for example. Other barrier layers are within the contemplated scope of disclosure.

The metal features 116 may be electrically connected to the gate electrodes 104, such that the first interconnect structure 110 may electrically interconnect semiconductor devices formed on the first semiconductor substrate 102.

The first seal ring 120 may extend around the periphery of the first die 100. For example, the first seal ring 120 may extend through the dielectric layers 112, 114, at the periphery of the first interconnect structure 110. The first seal ring 120 may be configured to protect the first interconnect structure 110 from contaminant diffusion and/or physical damage during device processing, such as plasma etching and/or deposition processes.

The first seal ring 120 may include copper at an atomic percentage greater than 80%, such as greater than 90% and/or greater than 95% although greater or lesser percentages may be used. The first seal ring 120 may include conductive lines and via structures that are connected to each other, and may be formed simultaneously with the metal features 116. The first seal ring 120 may be electrically isolated from the metal features 116.

In some embodiments, the metal features 116 and/or the first seal ring 120 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 116 and/or the first seal ring 120 may be formed by an electroplating process.

For example, the Damascene processes may include patterning the dielectric layers 112, 114 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden).

In particular, the patterning, metal deposition, and planarizing processes may be performed for each of the dielectric layers 112, 114, in order to form the metal features 116 and/or the portions of the first seal ring 120 therein. For example, dielectric layer may be deposited and patterned to form openings. A deposition process may then be performed to fill the openings in the dielectric layer. A planarization process may then be performed to remove the overburden and form metal features 116 in the dielectric layer. These process steps may be repeated to form each of the dielectric layers 112, 114 and the corresponding metal features 116, and thereby complete the first interconnect structure 110 and/or first seal ring 120.

The front side bonding layer 130 may be disposed on the first interconnect structure 110, facing the front side of the first semiconductor substrate 102. The front side bonding layer 130 may be formed by depositing a dielectric material, such as silicon oxide, silicon nitride, a polymer, or a combination thereof, using any suitable deposition process. Other dielectric materials are within the contemplated scope of disclosure. Metal features 132 may be formed in the front side bonding layer 130. The metal features 132 may include an electrically conductive metal, such as tungsten (W), copper (Cu), a copper alloy, aluminum (Al), an aluminum alloy, or a combination thereof. Other electrically conductive materials are within the contemplated scope of disclosure. The metal features 132 may be formed by a dual-Damascene processes, or by one or more single-Damascene processes, as described above. In alternative embodiments, the metal features 132 may be formed by an electroplating process.

A first dielectric encapsulation (DE) layer 60 may be deposited to surround the first die 100 and may cover exposed portions of the wafer 50. Specifically, the first DE layer 60 may surround the sidewalls of the first die 100, expose the top of the first die 100, and overlay the front side of the wafer 50. In some embodiments, the back side of the first semiconductor substrate 102 may be substantially coplanar with the top surface of the first DE layer 60. In some embodiments, the first DE layer 60 includes a molding compound. The molding compound may include a resin and a filler. In alternative embodiments, the first DE layer 60 may include silicon oxide, silicon nitride, or a combination thereof. The first DE layer 60 may be formed by spin-coating, lamination, deposition or the like.

A back side bonding layer 40 may be formed on the back side of the first semiconductor substrate 102 and on the surface of the first DE layer 60. The back side bonding layer 40 may be formed by depositing a dielectric material, such as silicon oxide, silicon nitride, a polymer, or a combination thereof, using any suitable deposition process. Die bonding feature 42 may be formed in the backside bonding layer 40. The die bonding feature 42 may be formed of a conductive metal as described above with respect to the metal features 116.

The first die 100 may also include one or more through silicon via (TSV) structures 150. The TSV structures 150 may extend through the first semiconductor substrate 102, the ILD layer 112, and one or more of the IMD layers 114, to electrically connect the metal features 116 to die bonding feature 42. The TSV structure 150 may be formed of an electrically conductive metal. For example, the TSV structure 150 may include copper at an atomic percentage greater than 80%, such as greater than 90% and/or greater than 95%, although greater or lesser percentages of copper may be used.

In some embodiments, the second die 200 may be similar to the first die 100. For example, the second die 200 may include a second semiconductor substrate 202, a second interconnect structure 210, and a front side bonding layer 230.

The second interconnect structure 210 may be disposed over a first side (e.g., front side) of the second semiconductor substrate 202. The second interconnect structure 210 may have a single-layer or multi-layer structure. For example, as shown in FIG. 1B, the second interconnect structure 210 may include an ILD layer 212, IMD layers 214, metal features 216, and a second seal ring 220.

The metal features 216 may be electrically connected to an integrated circuit region of the second semiconductor substrate 202. In some embodiments, the metal features 216 may be electrically connected to gate electrodes 204 of the second semiconductor substrate 202, such that the second interconnect structure 210 may electrically connect semiconductor devices formed on the second semiconductor substrate 202.

The second seal ring 220 may be similar to the first seal ring 120. For example, the second seal ring 220 may include copper at an atomic percentage greater than 80%, such as greater than 90% and/or greater than 95%, although greater or lesser percentages of copper may be used. The second seal ring 220 may be disposed over the front side of the second semiconductor substrate 202. Specifically, the second seal ring 220 may surround the second interconnect structure 210, may extend through the dielectric layers 212, 214, and may surround the metal features 216. In some embodiments, the second seal ring 220 may be formed during the formation of the dielectric layers 212, 214. The top surface of the second seal ring 220 may be coplanar with the top surfaces of the uppermost metal features 216 of the second interconnect structure 210.

In some embodiments, the size of the second die 200 may be different from (e.g., less than) the size of the first die 100. Herein, the term "size" refers to the length, width and/or area. For example, as shown in the top view of FIG. 1A, the size (e.g., area or footprint) of the second die 200 may be less than the size of the first die 100.

The second die 200 may also include one or more through silicon via (TSV) structures 250. The TSV structure 250 may extend through the second semiconductor substrate 202, the ILD layer 212, and one or more of the IMD layers 214, to electrically connect one of the metal features 216 to a die bonding metal feature 46. The TSV structure 250 may be formed of an electrically conductive metal. For example, the TSV structure 250 may include copper at an atomic percentage greater than 80%, such as greater than 90% and/or greater than 95%, although greater or lesser percentages of copper may be used.

A second DE layer 62 may surround the second die 200 and may cover exposed portions of the back side bonding layer 40. Specifically, the second DE layer 62 may surround the sidewalls of the second die 200, expose the top of the second die 200, and overlay back side bonding layer 40. In some embodiments, the back side of the second semiconductor substrate 202 may be substantially co-planar with the top surface of the second DE layer 62. In some embodiments, the second DE layer 62 includes a molding compound. The molding compound may include a resin and a filler. In alternative embodiments, the second DE layer 62 may include silicon oxide, silicon nitride, or a combination thereof. The second DE layer 62 may be formed by spin-coating, lamination, deposition or the like.

A back side bonding layer 44 may be formed on the back side of the second semiconductor substrate 202 and on the top surface of the second DE layer 62. The back side bonding layer 44 may be formed by depositing a dielectric material, such as silicon oxide, silicon nitride, a polymer, or a combination thereof, using any suitable deposition process. Metal features 46 may be formed in the backside bonding layer 40. The metal features 46 may be formed of a conductive metal as described above with respect to the metal features 116.

The third die 300 may be similar to the second die 200. For example, the third die 300 may include a third semiconductor substrate 302, a third interconnect structure 310, and a front side bonding layer 330.

The third interconnect structure 310 may be disposed over a first side (e.g., front side) of the third semiconductor substrate 302. The third interconnect structure 310 may have a single-layer or multi-layer structure. For example, as shown in FIG. 1B, the third interconnect structure 310 may include an ILD layer 312, IMD layers 314, metal features 316, and a third seal ring 320.

The metal features 316 may be electrically connected to an integrated circuit region of the third semiconductor substrate 302. In some embodiments, the metal features 316 may be electrically connected to gate electrodes 304 of the third semiconductor substrate 302, such that the third interconnect structure 310 may electrically connect semiconductor devices formed on the third semiconductor substrate 302.

The third seal ring 320 may be similar in structure and composition to the seal ring 220. The front side bonding layer 330 may be similar in structure and composition to the front side bonding layer 230. In particular, electrically conductive metal features 332 may be formed in the front side bonding layer 330.

The third die 300 may also include one or more through silicon via (TSV) structures 350. The TSV structures 350 may extend through the third semiconductor substrate 302, the ILD layer 312, and one or more of the IMD layers 314, to electrically connect one or more of the metal features 316 to corresponding gate electrodes 304 of the third semiconductor substrate 302. The TSV structure 350 may be formed of an electrically conductive metal. For example, the TSV structure 350 may include copper at an atomic percentage greater than 80%, such as greater than 90% and/or greater than 95%, although greater or lesser percentages of copper may be used.

A third DE layer 64 may surround the third die 300 and may cover exposed portions of the back side bonding layer 44. Specifically, the third DE layer 64 may surround the sidewalls of the third die 300, expose the top of the third die 300, and overlay back side bonding layer 44. In some embodiments, the back side of the third semiconductor substrate 302 may be substantially co-planar with the top surface of the third DE layer 64. In some embodiments, the third DE layer 64 includes a molding compound. The molding compound may include a resin and a filler. In alternative embodiments, the third DE layer 64 may include silicon oxide, silicon nitride, or a combination thereof. The third DE layer 64 may be formed by spin-coating, lamination, deposition or the like.

In some embodiments, a diffusion barrier layer (not shown) may be disposed around the metal features 116, 216, 316, and/or the TSV structures 150, 250, 350, to prevent metal diffusion into adjacent layers. The diffusion barrier layer may include Ta, TaN, Ti, TiN, CoW, or a combination thereof. Other suitable barrier layer materials may be within the contemplated scope of disclosure.

A redistribution layer structure 400 may be disposed on the backside of the third die 300, over the third DE layer 64. The redistribution layer structure 400 may include one or more dielectric layers 414, metal features 416, bonding pads 418, a fourth seal ring 420, and a passivation layer 430. In some embodiments, the metal features 416 may be electrically connected to the TSV structures 350.

In some embodiments, the dielectric layers 414 may include a photo-sensitive material such as polybenzoxazole (PBO), polyimide (PI), benzocyclobutene (BCB), a combination thereof, or the like. In some embodiments, the metal features 416 may include copper, nickel, titanium, a combination thereof, or the like. Other suitable conductive metal materials may be within the contemplated scope of disclosure to form the metal features 416.

The fourth seal ring 420 may surround the metal features 416. The fourth seal ring 420 may include materials and structures similar to that of the first seal rings 120 and/or second seal ring 220.

The bonding pads 418 may be disposed on the dielectric layers 414. In some embodiments, the bonding pads 418 may be under bump metallization (UBM) pads for mounting conductive connectors, such as metal pillars, microbumps or the like. The bonding pads 418 may include a metal or a metal alloy. The bonding pads 418 may include aluminum, copper, nickel, an alloy thereof, or the like, for example. Other suitable pad materials may be within the contemplated scope of disclosure.

The passivation layer 430 may cover the dielectric layers 414 and edge portions of the bonding pads 418. Upper surfaces of the bonding pads 418 may be exposed through the passivation layer 430. In some embodiments, the passivation layer 430 includes silicon oxide, silicon nitride, benzocyclobutene (BCB) polymer, polyimide (PI), polybenzoxazole (PBO), a combination thereof, or the like. Other suitable passivation layer materials are within the contemplated scope of disclosure.

The first die 100 may be flipped (e.g., inverted) and disposed over the wafer 50. The front side bonding layer 130 may be bonded to the wafer bonding layer 56, in order to bond the first die 100 to the wafer 50. The bonding may include any suitable bonding process, such as a thermal annealing or chemical bonding process. The bonding process may include electrically connecting the metal features 132 to metal features (not shown) of the wafer bonding layer 56. The first DE layer 60 may then be deposited about the first die 100. The back side bonding layer 40 may be deposited on the first die 100 and the first DE layer 60, using any suitable deposition process.

The second die 200 may be flipped (e.g., inverted) and disposed over the first die 100. The front side bonding layer 230 may be bonded to the backside bonding layer 40, to bond the front side of the second die 200 to the back side of the first die 100. The bonding may include any suitable bonding process, such as a thermal annealing or chemical bonding process. The bonding process may include electrically connecting the metal features 42, 232. The second DE layer 62 may then be deposited about the second die 200. The back side bonding layer 44 may be deposited on the second die 200 and the second DE layer 62, using any suitable deposition process.

The third die 300 may be flipped (e.g., inverted) and disposed over the second die 200. The front side bonding layer 330 may be bonded to the backside bonding layer 44, to bond the back side of the second die 200 to the front side of the third die 300. The bonding may include any suitable bonding process, such as a thermal annealing or chemical bonding process. The bonding process may include electrically connecting the metal features 46, 332. The third DE layer 64 may then be deposited about the third die 300. The redistribution layer structure 400 may then be formed on the third die 300 and the third DE layer 64, using any suitable deposition processes.

The metal features 42, 46, 132, 232, 332, may include an electrically conductive bonding material, such as tungsten (W), copper (Cu), a copper alloy, aluminum (Al), an aluminum alloy, or a combination thereof, and the bonding layers 40, 44, 56, 130, 230, 330 may be formed of any suitable dielectric material. The metal features 42, 46, 132, 232, 332, and the bonding layers 40, 44, 56, 130, 230, 330 may be formed by a dual-Damascene processes, by one or more single-Damascene processes, or by etching and electroplating processes.

In various embodiments, the first die 100, the second die 200, and the third die 300 may be formed on wafers and may be singulated prior to being individually positioned and bonded. In other embodiments, wafers including a plurality of the first die 100, the second die 200, and the third die 300 may be disposed over the wafer 50, the corresponding dies may be wafer-bonded, and then the corresponding dies may be singulated.

In some embodiments, the alignment of the first die 100, the second die 200, and the third die 300 may be achieved by using an optical sensing method. After the alignment is achieved, the bonding may be performed by a hybrid bonding process that includes a metal-to-metal bonding and a dielectric-to-dielectric bonding.

In various embodiments, a dicing process may be performed to singulate the three-dimensional device structure 10. For example, a grooving process may be performed to form grooves in a first wafer including the first dies 100 and/or in a second wafer including the second dies 200. In particular, first grooves may be formed that surround first seal ring 120, second seal ring 220, and/or third seal ring 320. The three-dimensional device structures 10 may be diced along the grooves to complete the dicing process, for example, by mechanical cleavage.

In certain embodiments, the grooving process includes performing one or more laser cutting processes. For example, the laser cutting process may be performed several times with an infrared laser such as an Nd-YAG (neodymium-doped yttrium aluminum garnet) laser. In alternative embodiments, the grooving process may include a mechanical cutting process, an inscribing process, or an etching process.

Embedded Integrated Passive Devices

According to various embodiments, various IPDs may be embedded in the 3D device structure 10, rather than surface-mounted on the 3D device structure 10 or on an underlying PCB or semiconductor substrate. For example, the 3D device structure 10 of FIGS. 1A-1C may include an IPD embedded in one of the first semiconductor substrate 102, second semiconductor substrate 202 or third semiconductor substrate 302, in order to improve space utilization efficiency. For example, as shown in FIGS. 1B and 1C, the IPD may be a deep trench capacitor (DTC) 500 disposed in the second semiconductor substrate 202, however, the present disclosure is not limited to any particular type of IPD or location. Further, while one DTC 500 is shown in FIGS. 1A-1C, the 3D device structure 10 may include any number of DTCs 500 and/or IPDs, based on the electrical demands and/or device layout of the 3D device structure 10. For example, one or more DTCs 500 may be embedded in any or all of the first semiconductor substrate 102, second semiconductor substrate 202 and/or third semiconductor substrate 302.

In some embodiments, the DTC 500 may be a metal-insulator-metal (MIM) capacitor, metal-ferroelectric-metal (MFM) or a metal-oxide-metal (MOM) capacitor, for example. However, the present disclosure is not limited to any particular type of capacitor. The DTC 500 may have a capacitance density of at least 100 nF/mm$^2$, for example, but the present disclosure is not limited to any particular capacitance density. Greater or lesser capacitance densities may also be used.

The DTC 500 may include a first conductive layer 502, a second conductive layer 504, and a first dielectric layer 506 disposed there between, such that a first conductive layer 502 surrounds the first dielectric layer 506, and the first dielectric layer 506 surrounds the second conductive layer 504. In various embodiments, the DTC 500 may include a second dielectric layer 508 disposed on the second conductive layer 504, such that a second conductive layer 504 surrounds the second dielectric layer 508. The conductive layers 502, 504 may include an electrically conductive material, such as copper, a copper alloy, aluminum, an aluminum alloy, tin, gold, silver, aluminum, tungsten, titanium, a combination thereof, or the like. However, other electrically conductive materials are within the scope of the present disclosure.

The first and second dielectric layers 506, 508 may be formed of any suitable dielectric material, such as $SiO_2$, SiON, SiN, $Ta_2O$, $Al_2O_3$ or the like. Other suitable dielectric materials, such as a ferroelectric material, may be within the contemplated scope of disclosure. In some embodiments, a diffusion barrier layer (not shown) may be disposed between the first conductive layer 502 and the second semiconductor substrate 202, to prevent metal diffusion into the second semiconductor substrate 202. The diffusion barrier layer may include Ta, TaN, Ti, TiN, CoW, or a combination thereof. Other suitable barrier layer and dielectric layer materials are within the scope of the present disclosure.

The DTC 500 may be electrically connected to components of any or all of the first die 100, the second die 200, and the third die 300, such as transistors, for example. For example, the DTC 500 may be electrically connected to components of the first semiconductor substrate 102, second semiconductor substrate 202 and third semiconductor substrate 302, the bonding layers 40, 230, 44, 330, the interconnect structures 110, 210, 310, and/or the redistribution layer structure 400. The DTC 500 may be configured to provide power to transistors formed on any and all of the first semiconductor substrate 102, second semiconductor substrate 202 and third semiconductor substrate 302.

In particular, the first conductive layer 502 may be electrically connected to electrically conductive elements of the second semiconductor substrate 202, the bonding layers 44, 330, and the second interconnect structure 210, by the TSV structure 250. For example, the TSV structure 250 may electrically connect the DTC 500 to a metal silicide in the second semiconductor substrate 202, metal features of the bonding layers 44, 330, metal features 216 of the second interconnect structure 210, and/or metal features 416 of the redistribution layer structure 400.

In various embodiments, the second conductive layer 504 may electrically contact a metal feature 332 of the front side bonding layer 330, which may be electrically connected to the metal features 316 of the third interconnect structure 310. The metal features 316 may be electrically connected to components of the third semiconductor substrate 302 and/or the metal features 416 of the redistribution layer structure 400, by the TSV structure 350.

In various embodiments, the DTC 500 may include a contact flange 510 comprising end regions of the first conductive layer 502, first dielectric layer 506, and second conductive layer 504 that are disposed on the upper surface of the second semiconductor substrate 202. The contact flange 510 may be configured to provide a larger surface area for connecting the conductive layers 502, 504 to the TSV 250 and the metal feature 332, respectively.

Figure 2:
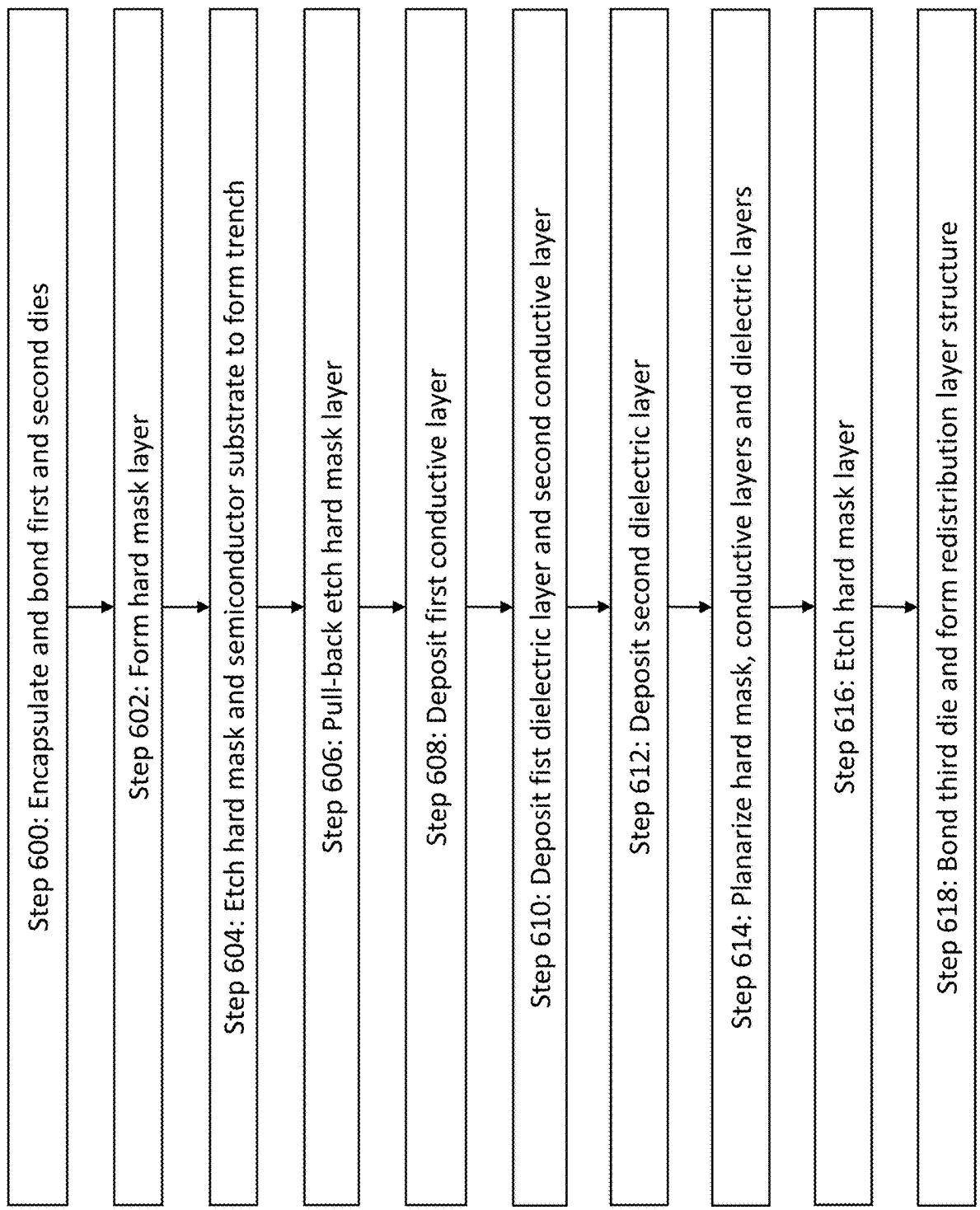
FIG. 2 is a flow chart showing a method of forming a deep trench capacitor (DTC) in the three-dimensional (3D) device structure of FIGS. 1A-1C, according to various embodiments of the present disclosure.
Figure 3A:
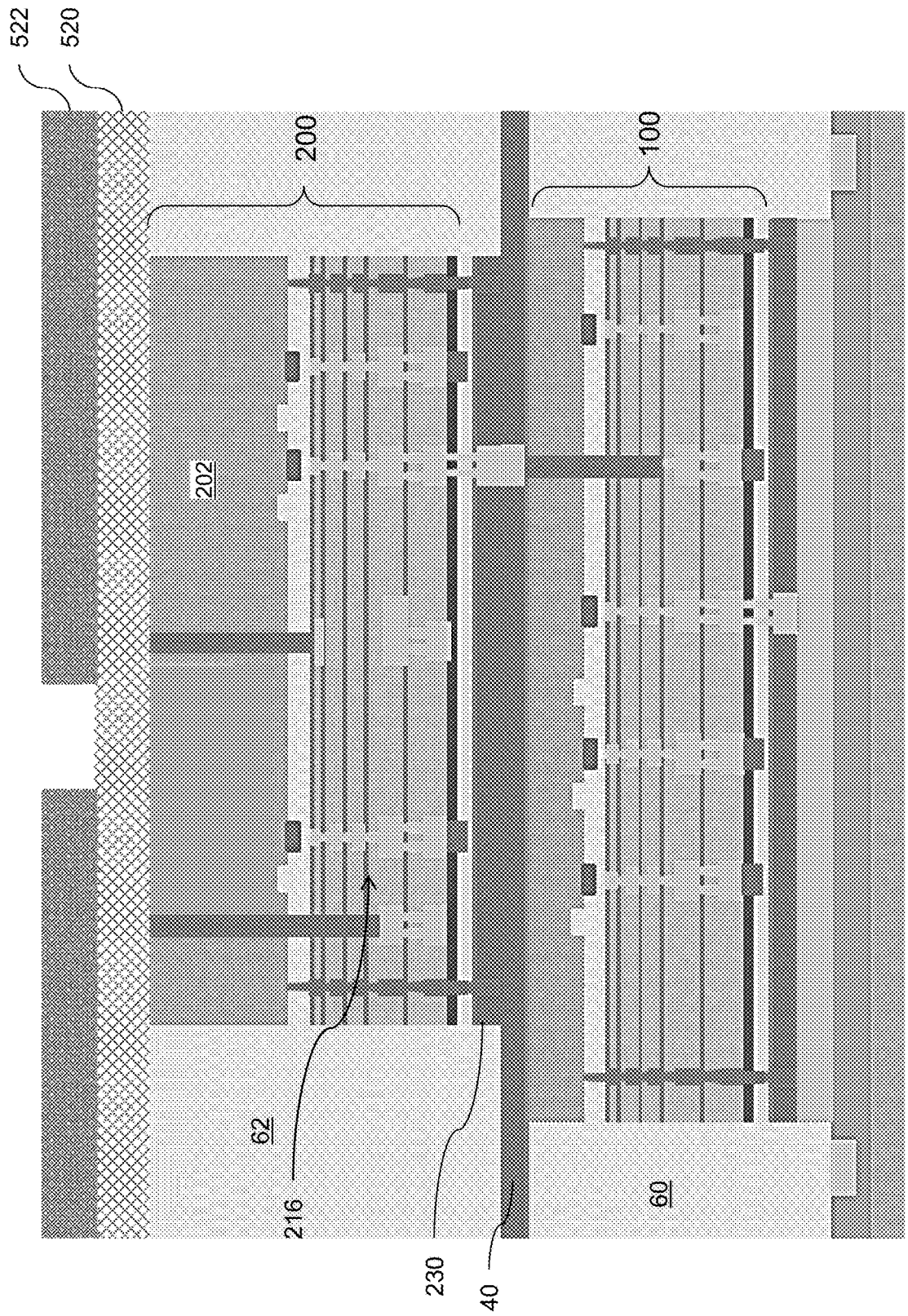
FIG. 3A is an intermediate structure formed during the formation of the 3D device structure after the second die may be bonded to the first die and after the deposition of the dielectric encapsulation (DE) layer, hard mask layer and photoresist layer.
Figure 3B:
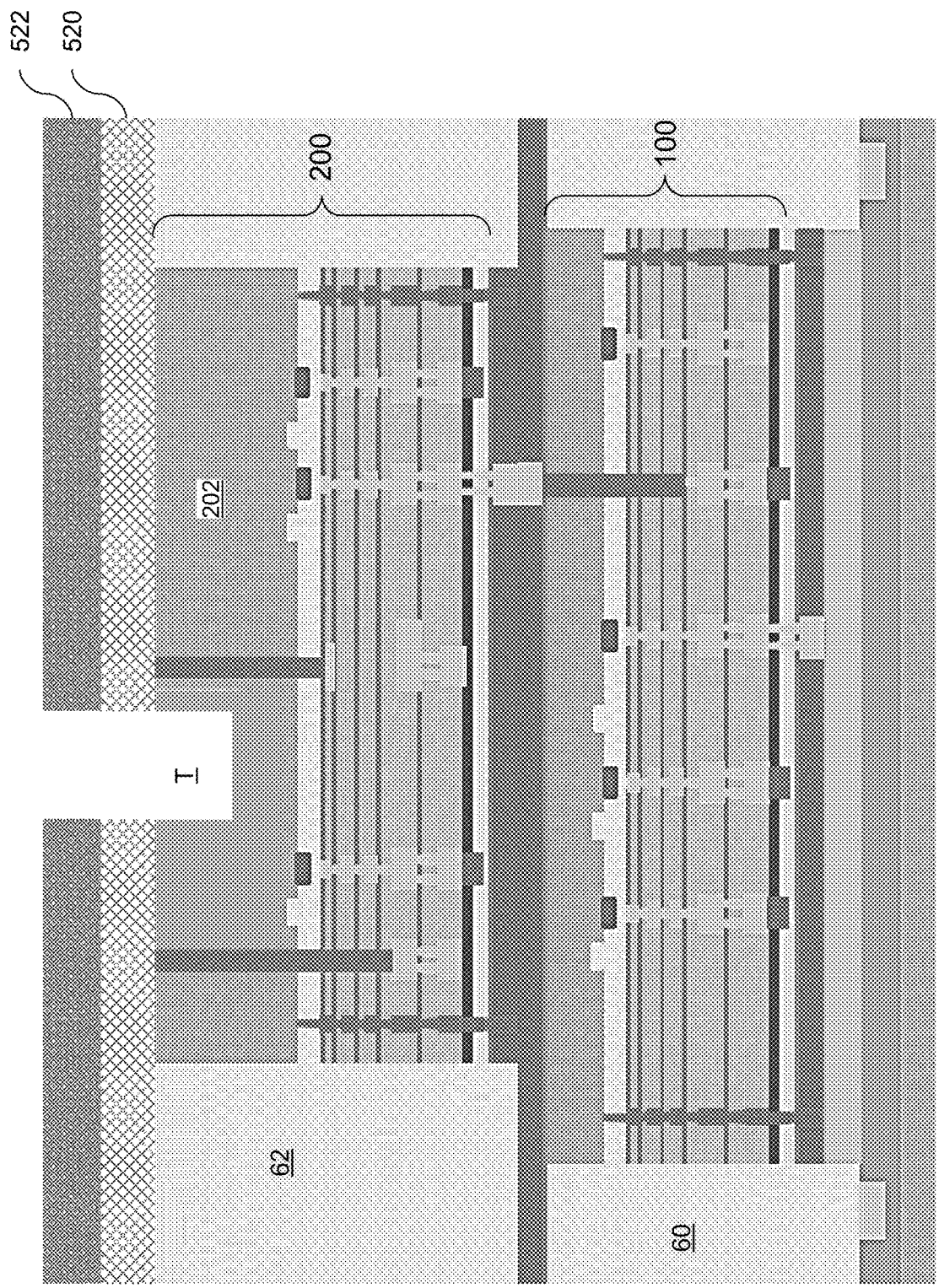
FIG. 3B is an intermediate structure formed during the formation of the 3D device structure after formation of a trench.
Figure 3C:
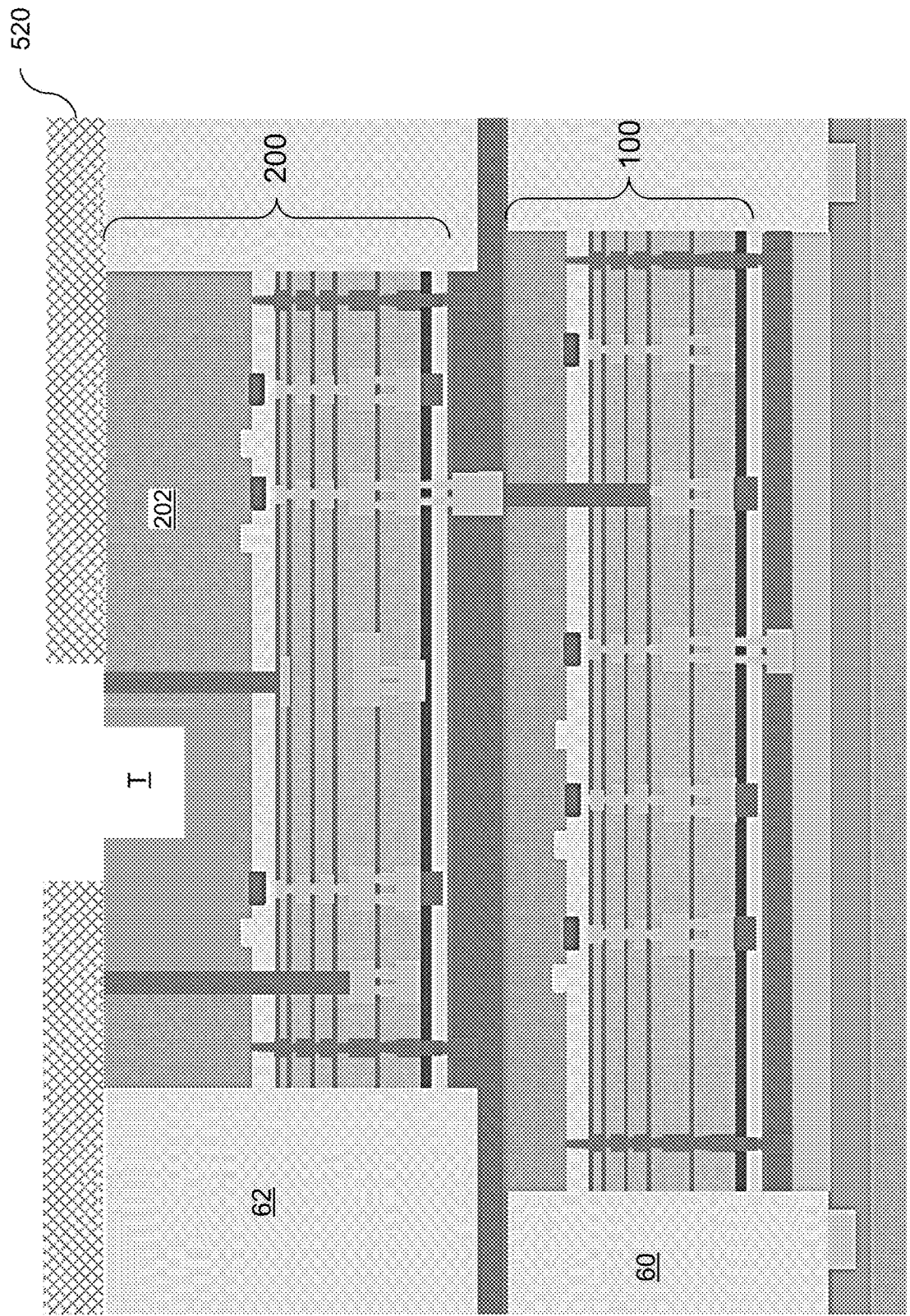
FIG. 3C is an intermediate structure formed during the formation of the 3D device structure after a pull-back etching process may be performed on hard mask layer to expose a portion of the top surface of the second semiconductor substrate that surrounds the trench.
Figure 3D:
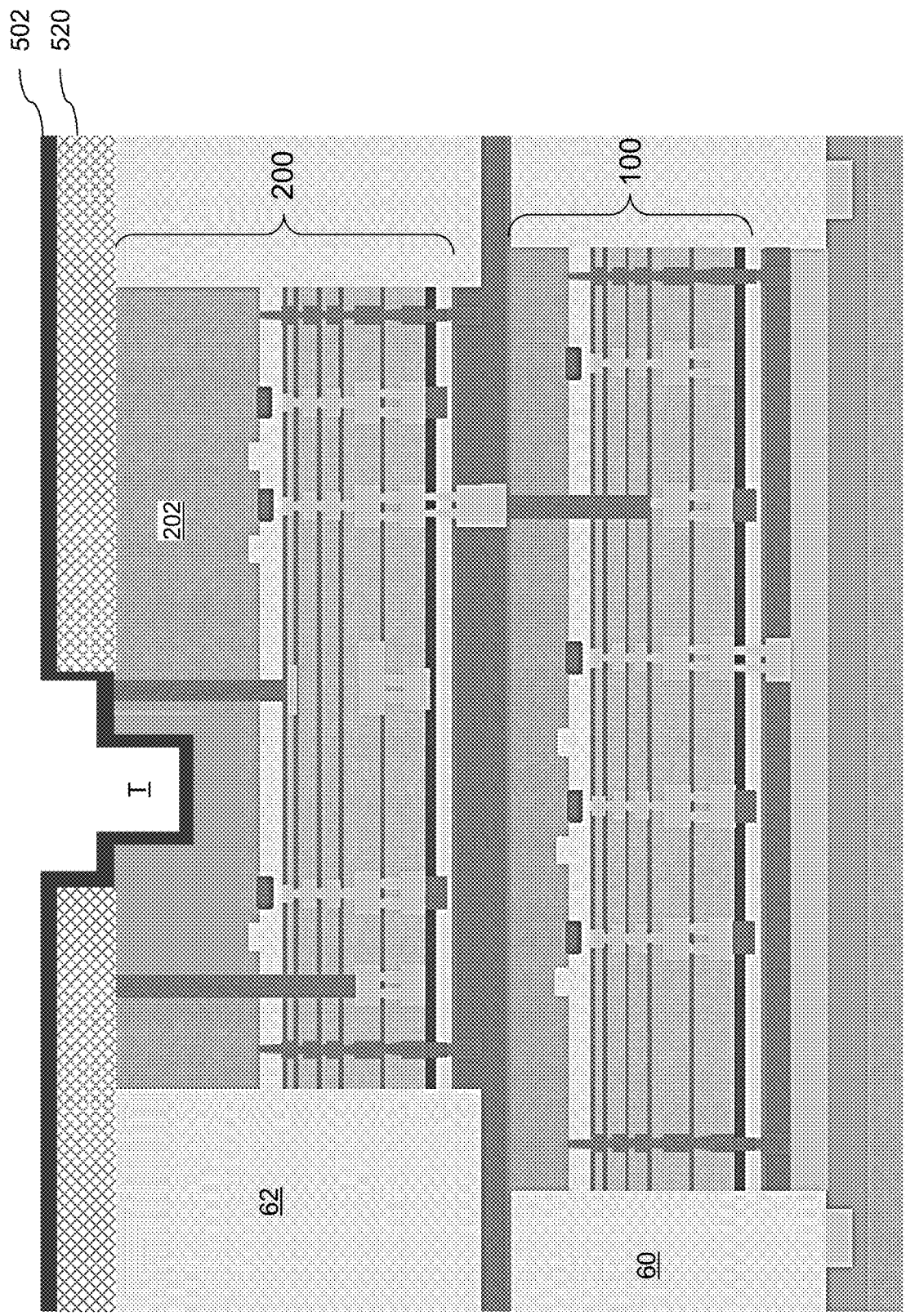
FIG. 3D is an intermediate structure formed during the formation of the 3D device structure after a deposition of a first conductive layer.
Figure 3E:
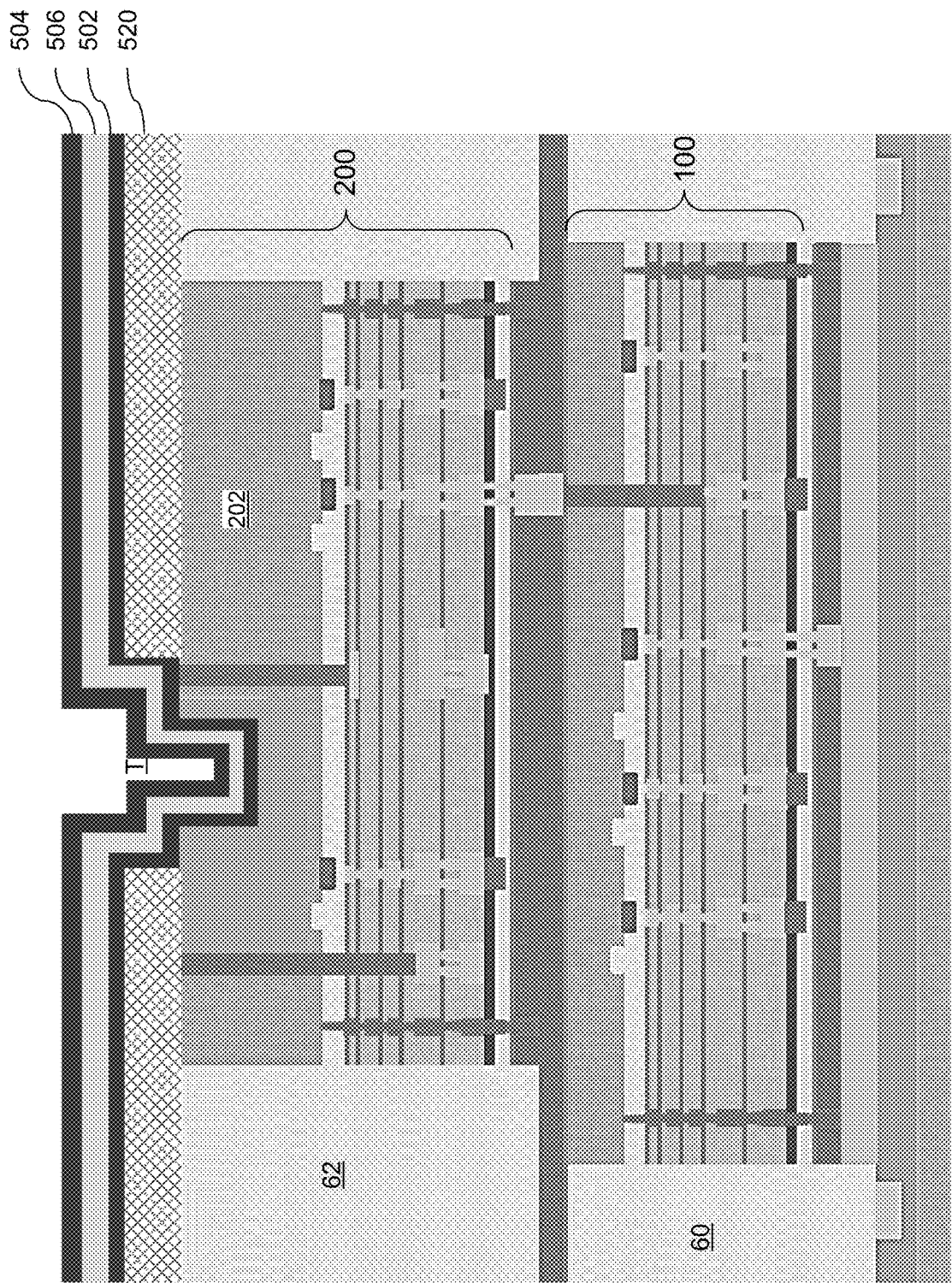
FIG. 3E is an intermediate structure formed during the formation of the 3D device structure after a deposition of a first dielectric and a second conductive layer.
Figure 3F:
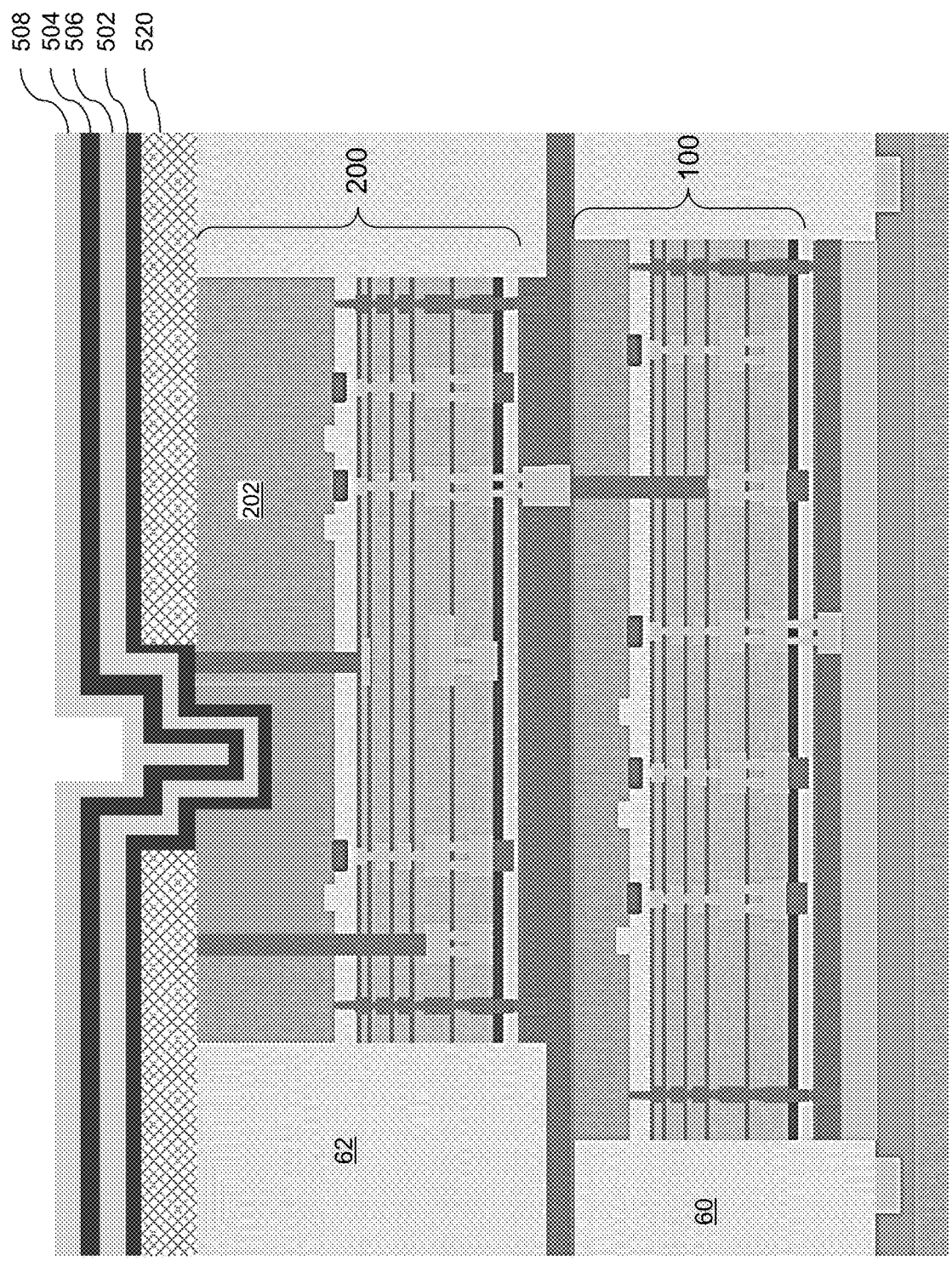
FIG. 3F is an intermediate structure formed during the formation of the 3D device structure after a deposition of a second dielectric layer.
Figure 3G:
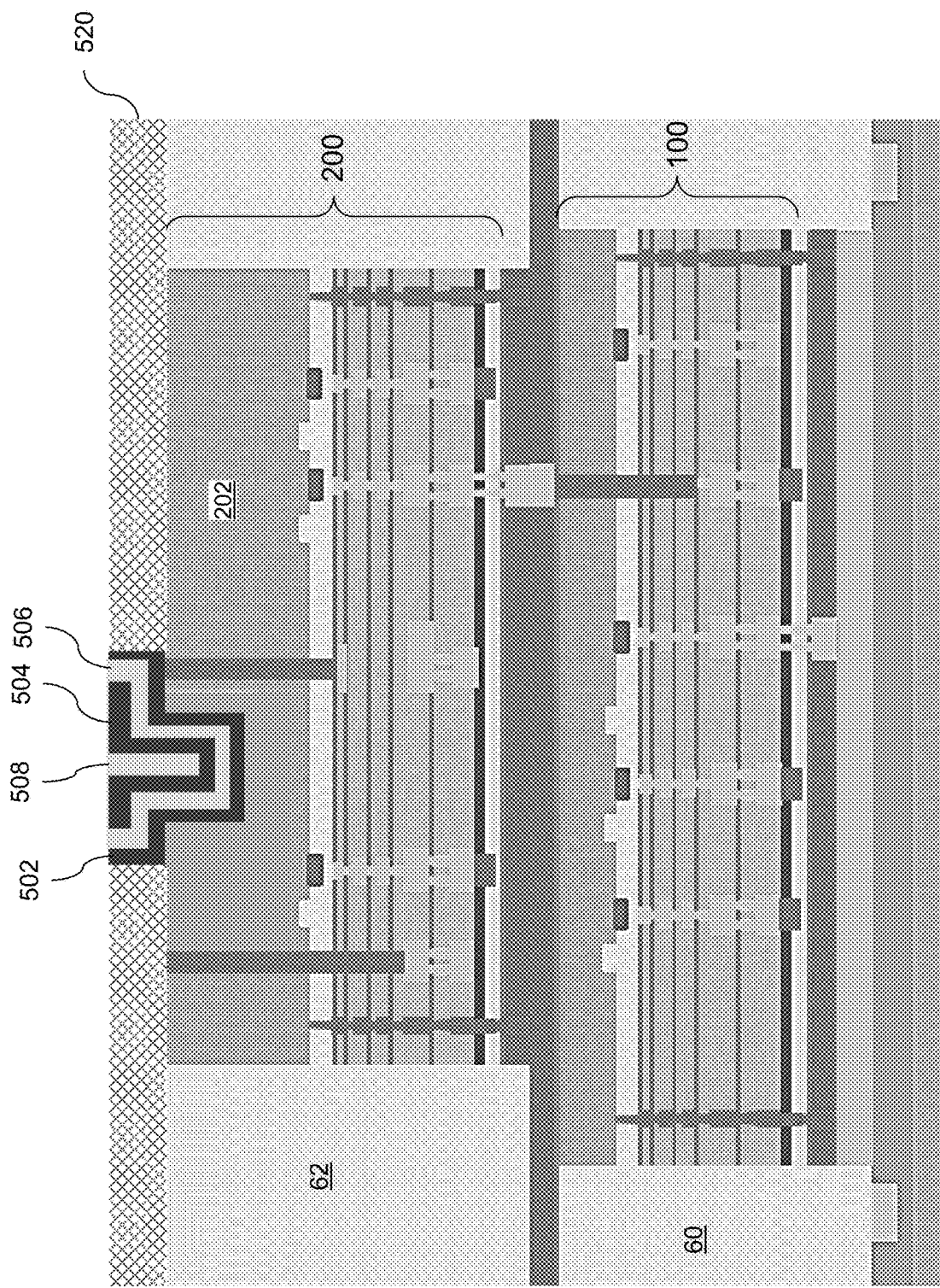
FIG. 3G is an intermediate structure formed during the formation of the 3D device structure after a planarization process is performed.
Figure 3H:
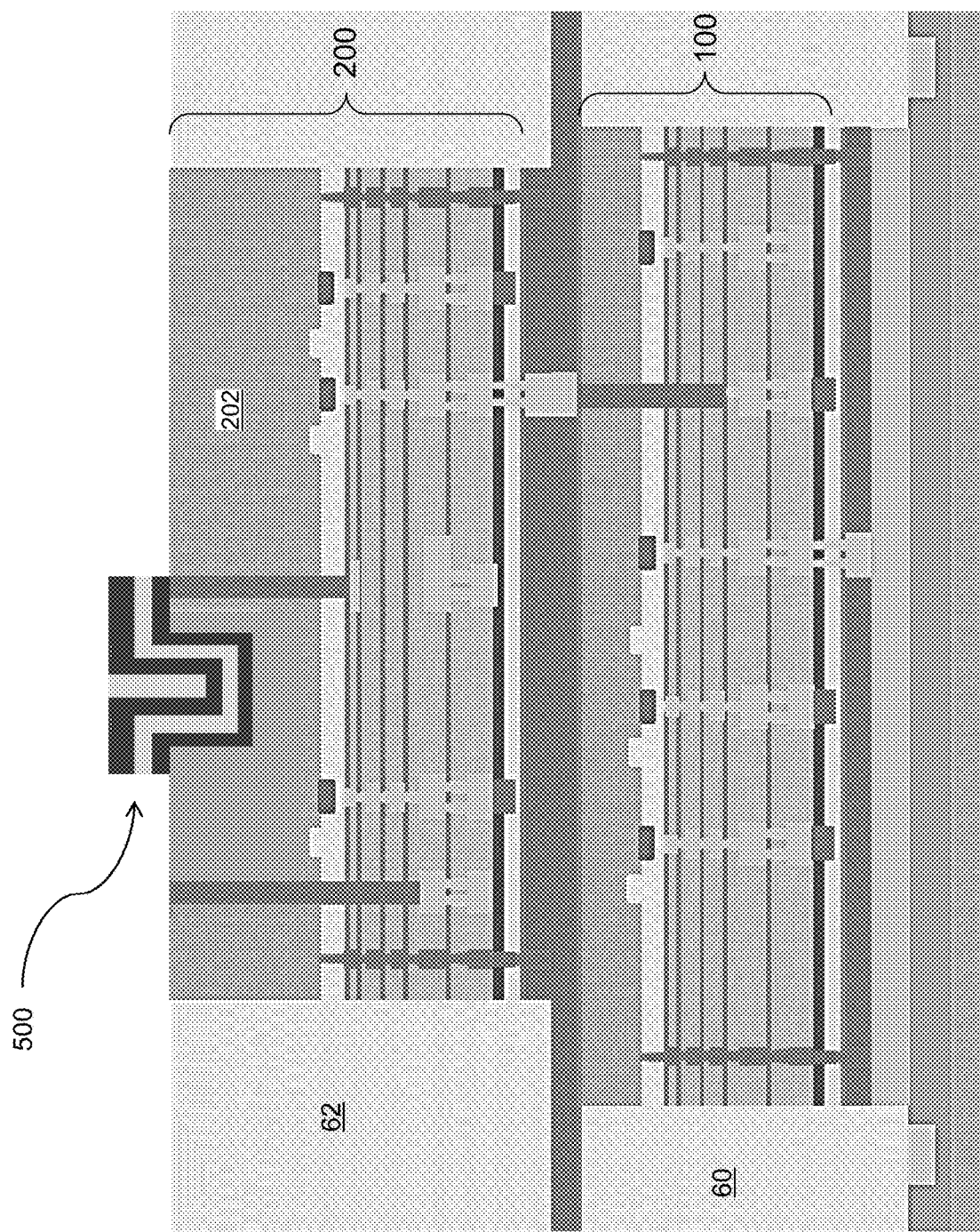
FIG. 3H is an intermediate structure formed during the formation of the 3D device structure after removal of the hard mask layer.
Figure 3I:
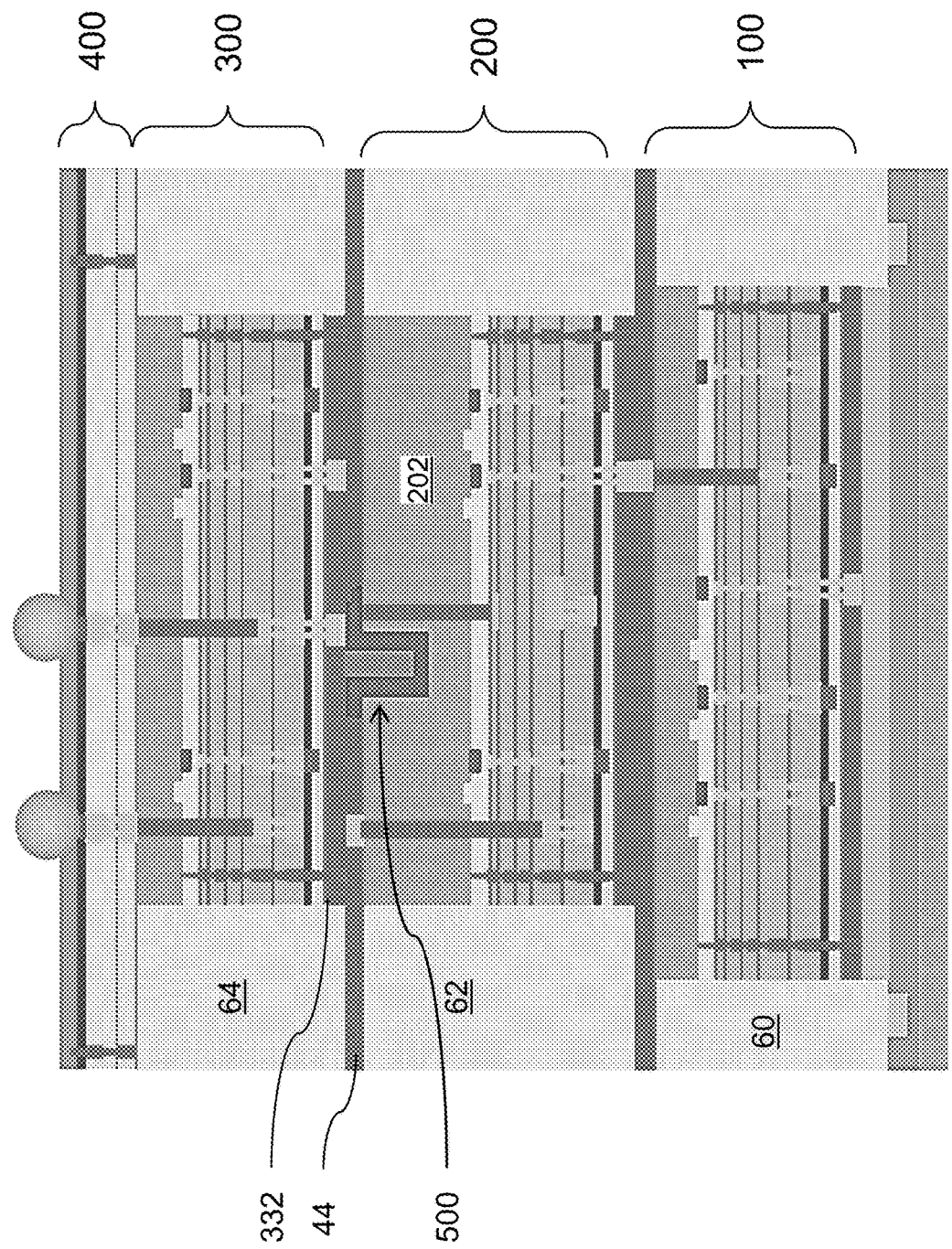
FIG. 3I is an intermediate structure formed during the formation of the 3D device structure after the third die may be bonded to the second die, and the redistribution layer structure may be formed over the third die.

FIG. 2 is a flow chart showing a method of forming a DTC 500 in a 3D device structure 10 as shown in FIGS. 1A-1C, according to various embodiments of the present disclosure. FIG. 3A is an intermediate structure formed during the formation of the 3D device structure 10 after the second die 200 may be bonded to the first die 100 and after the deposition of the first DE layer 60, hard mask layer 520 and photoresist layer 522. FIG. 3B is an intermediate structure formed during the formation of the 3D device structure 10 after formation of a trench T. FIG. 3C is an intermediate structure formed during the formation of the 3D device structure 10 after a pull-back etching process may be performed on hard mask layer 520 to expose a portion of the top surface of the second semiconductor substrate 202 that surrounds the trench T. FIG. 3D is an intermediate structure formed during the formation of the 3D device structure 10 after a deposition of a first conductive layer 502. FIG. 3E is an intermediate structure formed during the formation of the 3D device structure 10 after a deposition of a first dielectric 506 and a second conductive layer 504. FIG. 3F is an intermediate structure formed during the formation of the 3D device structure 10 after a deposition of a second dielectric layer 508. FIG. 3G is an intermediate structure formed during the formation of the 3D device structure 10 after a planarization process is performed. FIG. 3H is an intermediate structure formed during the formation of the 3D device structure 10 after removal of the hard mask layer 520. FIG. 3I is an intermediate structure formed during the formation of the 3D device structure 10 after the third die 300 may be bonded to the second die 200, and the redistribution layer structure 400 may be formed over the third die 300.

Referring to FIGS. 2 and 3A, in step 600 the second die 200 may be inverted and bonded to the first die 100 by the back side bonding layer 40 and front side bonding layer 230. In particular, the first die 100 may be bonded to the wafer 50 and encapsulated with the first DE layer 60. The back side bonding layer 40 may be deposited on the first DE layer 60 and the back side of the first semiconductor substrate 102. The front side bonding layer 230 may be positioned on the back side bonding layer 40 and the resulting structure may be annealed. The second DE layer 62 may then be deposited around the second die 200.

In step 602, a hard mask layer 520 may be deposited on the second die 200 and the second DE layer 62. Examples of a suitable material for the hard mask layer 520 include, but are not limited to, $SiO_2$, $Si_3N_4$, SiON, SiC, SiOC, or any combination thereof. Other suitable hard mask materials are within the contemplated scope of disclosure. A photoresist layer 522 may be formed on the hard mask layer 520. The photoresist layer 522 may be patterned under a photo mask, and then etched to expose a portion of hard mask layer 520.

Referring to FIGS. 2 and 3B, in step 604, the hard mask layer 520 and the second semiconductor substrate 202 may be etched using one or more etching processes, to form a trench T in the second semiconductor substrate 202. The etching may include a dry etching method such as plasma (e.g., fluorine containing plasma) etching, a wet etching process, or a combination thereof. The photoresist layer 522 may be removed after the etching process, for example, by ashing, dissolved or consumed by the etching process.

Referring to FIGS. 2 and 3C, in step 606, a pull-back etching process may be performed on hard mask layer 520 to expose a portion of the top surface of the second semiconductor substrate 202 that surrounds the trench T. In some embodiments, the pull-back etching may be performed by applying an acid solution to a portion of the hard mask layer 520.

Referring to FIGS. 2 and 3D, in step 608 the first conductive layer 502 may conformally deposited in the trench T and on the hard mask layer 520, using any suitable deposition method, such as using chemical vapor deposition (CVD), high density plasma CVD, sputtering, etc. The first conductive layer 502 may include an electrically conductive material such as for example copper, a copper alloy, aluminum, an aluminum alloy, tin, gold, silver, aluminum, tungsten, titanium, a combination thereof, or the like. Other electrically conductive materials are within the contemplated scope of disclosure.

Referring to FIGS. 2 and 3E, in step 610 the first dielectric layer 506 may be conformally deposited over the first conductive layer 502, and the second conductive layer 504 may be conformally deposited over the first dielectric layer 506. The first dielectric layer 506 may be formed of any suitable dielectric material, such as $SiO_2$, SiON, SiN, $Ta_2O$, $Al_2O_3$, or the like, and may be formed by using any using any suitable deposition method, such as using chemical vapor deposition (CVD), high density plasma CVD, sputtering, etc. The second conductive layer 504 may be conformally formed using methods and materials as described with respect to the first conductive layer 502.

Referring to FIGS. 2 and 3F, in step 612 the second dielectric layer 508 may be formed over the second conductive layer 504. The second dielectric layer 508 may be formed using deposition methods and materials as described with respect to the first dielectric layer 506.

Referring to FIGS. 2 and 3G, in step 614 a planarization process, such as chemical mechanical planarization (CMP), may be performed to reduce the thickness of the hard mask layer 520 and/or to remove portions of the conductive layers 502, 504 and the dielectric layers 506, 508 that are disposed above the upper surface of the hard mask layer 520.

Referring to FIGS. 2 and 3H, in step 616 the hard mask layer 520 may be etched to expose the second die 200, the upper surface of the second DE layer 62, and the top of a completed DTC 500. Etching the hard mask layer 520 can be performed using a dry etching method such as plasma etching in some embodiments, or a wet etching method such as acid etching in some other embodiments.

Referring to FIGS. 2 and 3I, in step 618 the third die 300 may be bonded to the second die 200, and the redistribution layer structure 400 may be formed over the third die 300. In particular, the back side bonding layer 44 may be deposited on the second die 200 and the second DE layer 62, and the front side bonding layer 330 may be position positioned over the back side bonding layer 44 and bonded thereto by an annealing process. The third DE layer 64 may be deposited around the third die 300. The redistribution layer structure 400 may then be formed over the third die 300 and the third DE layer 64.

Various embodiments provide a three-dimensional device structure 10 comprising a die 200, wherein the die 200 comprises: a semiconductor substrate 202; an interconnect structure 210 disposed on the semiconductor substrate 202; a through silicon via (TSV) structure 250 that extends through the semiconductor substrate 202 and electrically contacts a metal feature 216 of the interconnect structure 210; and an integrated passive device (IPD) 500 embedded in the semiconductor substrate 202 and electrically connected to the TSV structure 250.

In an embodiment, the three-dimensional device structure 10 may include an IPD, wherein the IPD includes a deep trench capacitor (DTC) 500 disposed in a trench T formed in the semiconductor substrate. In one embodiment, the DTC 500 may include a first conductive layer 502 electrically connected to the TSV structure 250; a second conductive layer 504 electrically connected to a metal feature a front side bonding layer; and a first dielectric layer 506 disposed between the first conductive layer 502 and the second conductive layer 504. In an embodiment, the second conductive layer 504 surrounds the second dielectric layer 508. In one embodiment three-dimensional device structure 10, the DTC 500 may be configured to provide power to transistors of the semiconductor substrate. In one embodiment three-dimensional device structure 10, the IPD may include deep trench capacitors (DTCs) disposed in trenches formed in the semiconductor substrate.

Various embodiments provide a three-dimensional device structure 10 comprising: a first die 100 comprising a first semiconductor substrate 102; a second die 200 bonded to the first die 100 and comprising a second semiconductor substrate 202 and a through silicon via (TSV) structure 250 that extends through the second semiconductor substrate 202; and an integrated passive device (IPD) 500 embedded in the second semiconductor substrate 202 and electrically connected to the TSV structure 250.

Various embodiments provide a three-dimensional device structure 10 comprising: a first die 100 comprising a first semiconductor substrate 102; a second die 200 bonded to the first die 100 and comprising a second semiconductor substrate 202 and a through silicon via (TSV) structure 250 that extends through the second semiconductor substrate 202; a deep trench capacitor (DTC) 500 embedded in the second semiconductor substrate 202 and electrically connected to the TSV structure 250; a third die 300 bonded to the second die 200 and comprising a third semiconductor substrate 302; and a redistribution layer structure 400 disposed over the third die 300. In one embodiment three-dimensional device structure 10, the three-dimensional device structure 10 may include a plurality of TSV structures 250 extending through the second semiconductor substrate 202; and a plurality of DTCs 500 embedded in the second semiconductor substrate 202 and connected the plurality of TSV structures 250.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional device structure comprising a die, wherein the die comprises:
    a semiconductor substrate;
    an interconnect structure disposed on the semiconductor substrate;
    a through silicon via (TSV) structure that extends through the semiconductor substrate and electrically contacts a metal feature of the interconnect structure; and
    an integrated passive device (IPD) embedded in the semiconductor substrate and electrically connected to the TSV structure, wherein the IPD comprises a deep trench capacitor (DTC) disposed in a trench formed in the semiconductor substrate.

2. The three-dimensional device structure of claim 1, wherein the DTC comprises:
    a first conductive layer electrically connected to the TSV structure;
    a second conductive layer electrically connected to a metal feature a front side bonding layer; and
    a first dielectric layer disposed between the first conductive layer and the second conductive layer.

3. The three-dimensional device structure of claim 2, wherein the second conductive layer surrounds the second dielectric layer.

4. The three-dimensional device structure of claim 1, wherein the DTC is configured to provide power to transistors of the semiconductor substrate.

5. A three-dimensional device structure comprising:
    a first die comprising a first semiconductor substrate;
    a second die bonded to the first die and comprising a second semiconductor substrate and a through silicon via (TSV) structure that extends through the second semiconductor substrate; and
    an integrated passive device (IPD) embedded in the second semiconductor substrate and electrically connected to the TSV structure, wherein the IPD comprises a deep trench capacitor (DTC) disposed in a trench formed in the second semiconductor substrate.

6. The three-dimensional device structure of claim 5, wherein the DTC comprises:
    a first conductive layer electrically connected to the TSV structure;
    a second conductive layer electrically connected to a metal feature a front side bonding layer; and
    a first dielectric layer disposed between the first conductive layer and the second conductive layer.

7. The three-dimensional device structure of claim 6, wherein the second conductive layer surrounds the second dielectric layer.

8. The three-dimensional device structure of claim 6, wherein:
    the second die comprises a second interconnect structure configured to electrically connect the second die to the first die; and
    the TSV structure is electrically connected to metal features of the second interconnect structure.

9. The three-dimensional device structure of claim 6, further comprising a third die bonded to the second die and comprising a third semiconductor substrate and a third interconnect structure, wherein the second conductive layer of the DTC is electrically connected to metal features of the third interconnect structure.

10. The three-dimensional device structure of claim 9, further comprising a redistribution layer structure disposed over the third die,
wherein the third die comprises a TSV structure that electrically connects the metal features of the third interconnect structure to metal features of the redistribution layer structure.

11. The three-dimensional device structure of claim 9, wherein the DTC is configured to provide power to electrical components of the first semiconductor substrate, the second semiconductor substrate, or the third semiconductor substrate.

12. The three-dimensional device structure of claim 6, wherein:
the DTC comprises a contact flange comprising end regions of the first conductive layer, first dielectric layer, and the second conductive layer that are disposed on an upper surface of the second semiconductor substrate; and
the TSV structure electrically contacts the contact flange.

13. The three-dimensional device structure of claim 5, wherein the IPD comprises deep trench capacitors (DTCs) disposed in trenches formed in the second semiconductor substrate.

14. The three-dimensional device structure of claim 5, further comprising a deep trench capacitor (DTC) disposed in a trench formed in the first semiconductor substrate.

15. The three-dimensional device structure of claim 5, further comprising a wafer bonded to the first die.

16. A three-dimensional device structure comprising:
a first die comprising a first semiconductor substrate;
a second die bonded to the first die and comprising a second semiconductor substrate and a through silicon via (TSV) structure that extends through the second semiconductor substrate;
a deep trench capacitor (DTC) embedded in the second semiconductor substrate and electrically connected to the TSV structure;
a third die bonded to the second die and comprising a third semiconductor substrate; and
a redistribution layer structure disposed over the third die.

17. The three-dimensional device structure of claim 8, further comprising:
a plurality of TSV structures extending through the second semiconductor substrate; and
a plurality of DTCs embedded in the second semiconductor substrate and connected to the plurality of TSV structures.

* * * * *